United States Patent
Mitarai et al.

(10) Patent No.: US 6,462,464 B2
(45) Date of Patent: Oct. 8, 2002

(54) STACKED PIEZOELECTRIC DEVICE AND METHOD OF FABRICATION THEREOF

(75) Inventors: Shinya Mitarai, Kuwana (JP); Masayuki Kobayashi, Kuwana (JP); Atsushi Murai, Kuwana (JP); Akio Sugiura, Kariya (JP); Kazuhide Sato, Aichi-pref. (JP); Isao Mizuno, Chiryu (JP)

(73) Assignee: Denso Corporation, Aichi.Pref. (JP)

( * ) Notice: Subject to any disclaimer, the term of this patent is extended or adjusted under 35 U.S.C. 154(b) by 0 days.

(21) Appl. No.: 09/985,270

(22) Filed: Nov. 2, 2001

(65) Prior Publication Data

US 2002/0053860 A1 May 9, 2002

(30) Foreign Application Priority Data

Nov. 6, 2000 (JP) ........................................ 2000-337807
Oct. 4, 2001 (JP) ........................................ 2001-308808

(51) Int. Cl.$^7$ ............................................. H01L 41/083
(52) U.S. Cl. ........................................ 310/366; 310/328
(58) Field of Search .................................. 310/328, 366

(56) References Cited

U.S. PATENT DOCUMENTS 5,459,368 A  * 10/1995  Onishi et al. ............ 310/313 R
6,097,134 A  *  8/2000  Kawabata et al. ............ 310/348
6,111,343 A  *  8/2000  Unami et al. ................ 310/328

FOREIGN PATENT DOCUMENTS

| JP | 57-78447 | 11/1983 | ........... H01L/41/08 |
| JP | 58-237329 | 7/1985 | ........... H01L/41/08 |
| JP | 61-228464 | 9/1986 | ........... H01L/41/08 |
| JP | 62-265105 | 4/1989 | ........... H01L/41/08 |
| JP | 62-306501 | 6/1989 | ........... H01L/41/08 |
| JP | 2-269845 | 5/1992 | ........... H01L/41/09 |

* cited by examiner

Primary Examiner—Thomas M. Dougherty
(74) Attorney, Agent, or Firm—Nixon & Vanderhye PC

(57) ABSTRACT

A stacked piezoelectric device and a method of fabrication thereof includes a piezoelectric stack having a first side electrode and a second side electrode, piezoelectric layers and internal electrode layers. The piezoelectric layers and internal electrode layers have substantially the same area. The internal electrode layers have ends thereof exposed to one side of the stack. The first side electrode includes first insulative portions formed at the ends of alternate ones of the internal electrode layers and a first conductive portion formed over the first insulative portions. The second side electrode is similarly configured to form insulative portions at the other ends. The first and second insulative portions are formed of an insulative resin, while the first and second conductive portions are formed of a conductive resin. The first and second conductive portions are also formed to directly cover the ends of the internal electrode layers.

17 Claims, 10 Drawing Sheets

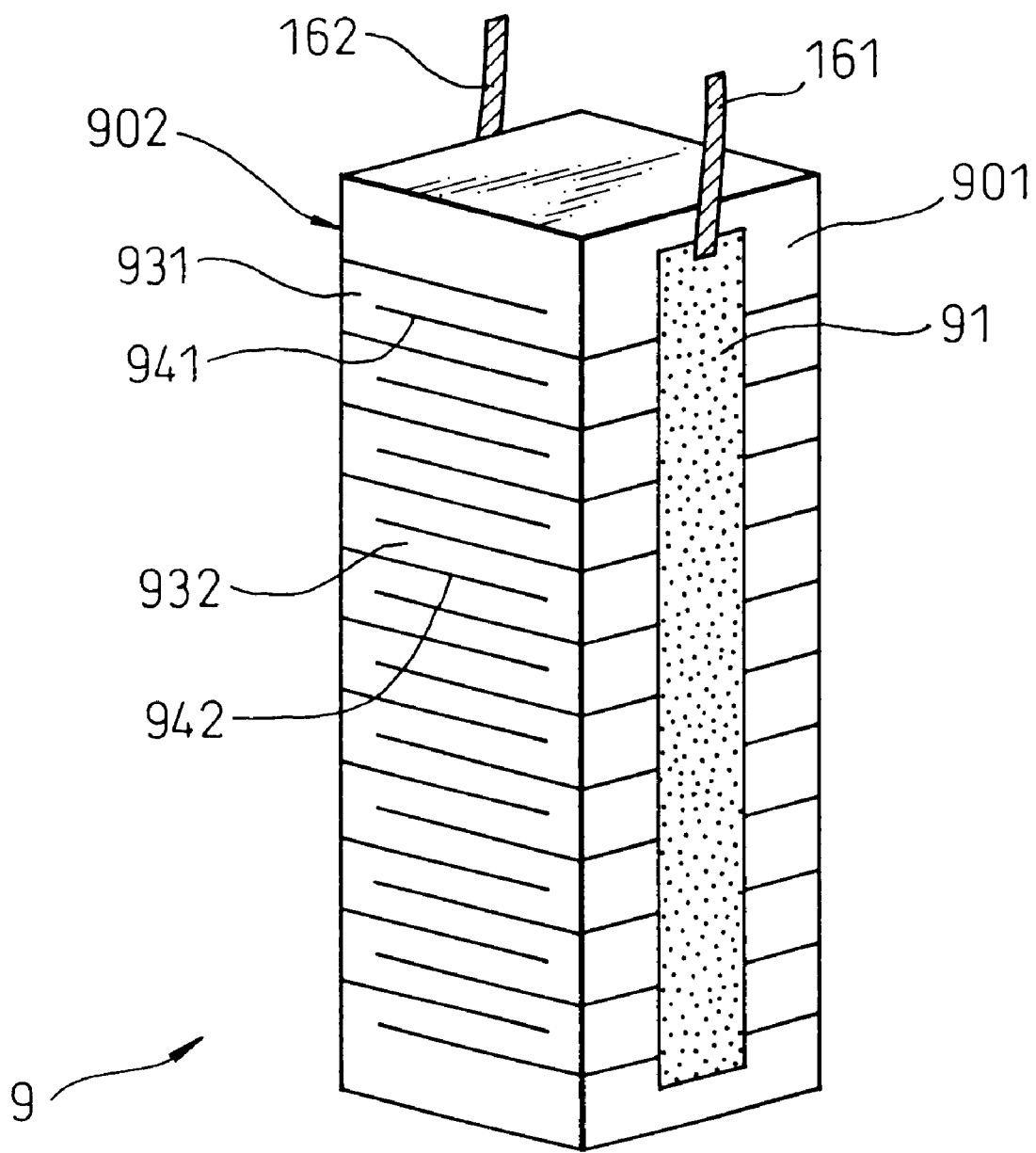

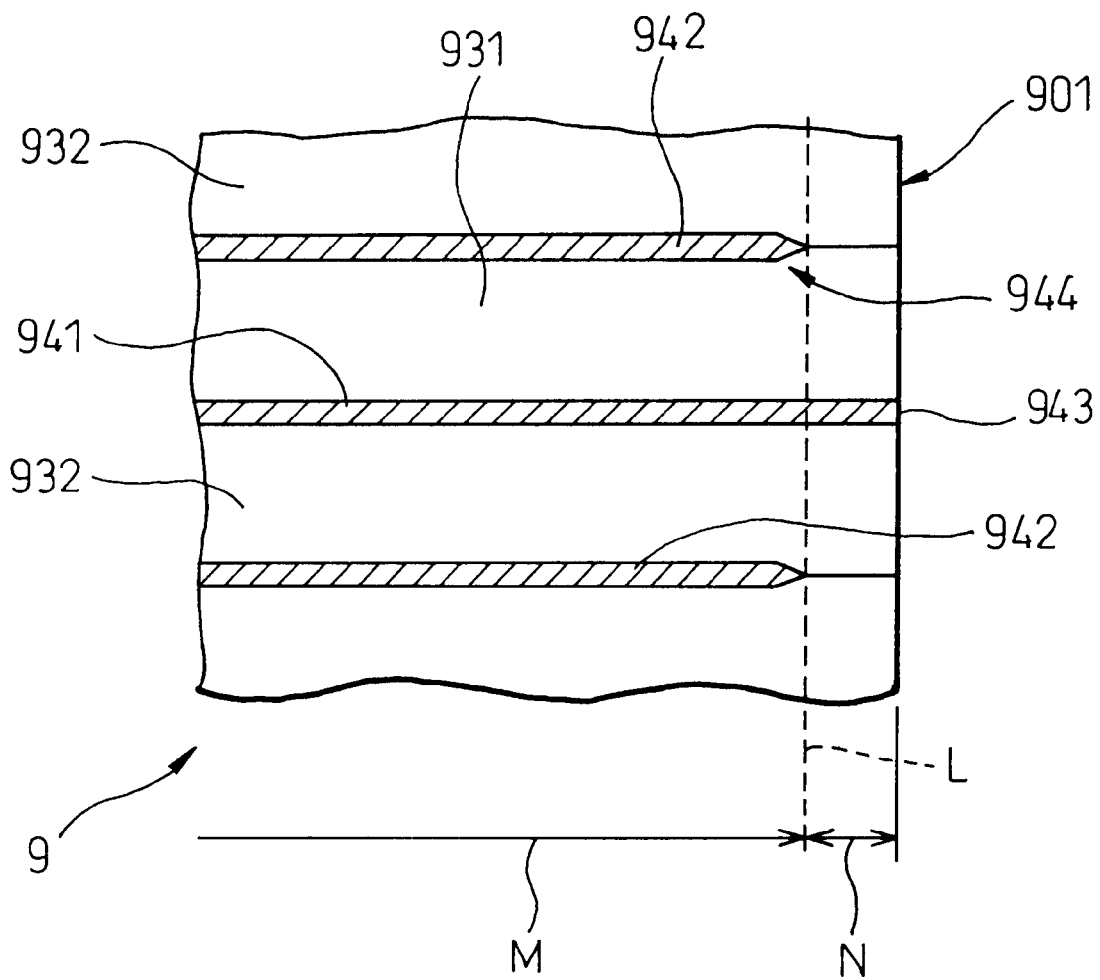

STACKED PIEZOELECTRIC DEVICE AND METHOD OF FABRICATION THEREOF

BACKGROUND OF THE INVENTION

1. Field of the Invention

The present invention relates to a stacked piezoelectric device adapted to extend and contract along the height of the stack upon energization and a method of fabrication thereof.

2. Description of the Related Art

The following-described configuration of the conventional stacked piezoelectric device is well known.

As shown in FIG. 14, a stacked piezoelectric device 9 comprises a piezoelectric stack formed of piezoelectric layers 931 and 932, internal electrode layers 941 and 942 alternately formed between the piezoelectric layers 931 and 932 with alternate positive and negative voltages applicable to the piezoelectric layers 931 and 932, and a pair of side electrodes 91 formed on the sides 901 and 902 of the piezoelectric stack.

In the piezoelectric stack, the internal electrode layers 941 are arranged to be exposed to the side 901, while the internal electrode layers 942 are arranged to be exposed to the other side 902.

A side electrode 91 is formed on each of the sides 901 and 902 of the piezoelectric stack in such a manner as to energize the ends of the internal electrode layers 941 and 942 exposed thereto. The other side electrode electrically connected with the ends of the internal electrode layers 942 is hidden and therefore not visible in FIG. 14.

The conventional stacked piezoelectric device 9 shown above has the problem that cracking tends to occur in the N portion of FIG. 15 in the direction toward the side 901 from the end of the internal electrode layer 941 (A similar problem is also affects the other side 902, not shown).

As shown in FIG. 15, the end portion 944 of the internal electrode layer 942 not exposed to the side 901 has a progressively tapered section in the piezoelectric stack. The end portion 943 of the internal electrode layer 941 is exposed to the side 901.

Though not shown, the end portion of the internal electrode layer 942 is exposed to the side 902, while the end of the internal electrode layer 941 is not exposed to the side 902 of the piezoelectric stack but located within the piezoelectric stack with the section thereof progressively tapered.

As a result, the piezoelectric layers 931 and 932 are divided into a portion M sandwiched between the internal electrode layer 941 and the internal electrode layer 942, and a portion N in contact with either the internal electrode layer 941 or 942.

Upon application of a voltage from the internal electrode layers 941 and 942 to the piezoelectric layers 931 and 932, the portion M sandwiched between the internal electrode layers 941 and 942 can be displaced along the height of the stack. The portion N, however, cannot be displaced, as it is in contact with only one of the internal electrode layers 941 and 942.

Stress develops in the portion L indicated by dashed line in FIG. 15 constituting the boundary between the portions M and N which is in contact with the portion displaced and the portion not displaced.

Thus, the piezoelectric stack may be damaged by cracking occurring from the end portion 942 toward the side 901.

This damage occurs especially after the stacked piezoelectric device is used for a long time or in a harsh operating environment, and has been a major cause of device deterioration.

Also, in the conventional stacked piezoelectric device 9, the internal electrode layers 941 and 942 are configured on a part of the piezoelectric layers 931 and 932. For this reason, a complicated and troublesome process control is required to form the internal electrode layers 941 and 942 of a predetermined size at exact positions on the piezoelectric layers 931 and 932 at the time of manufacture, and therefore simplification of the process control is desirable.

In order to obviate this problem, a method has been proposed to form each internal electrode layer over the entire surface of the corresponding piezoelectric layer.

In this configuration, the internal electrode layers and the piezoelectric layers have substantially the same area. Also, each side electrode is configured in such a manner that the ends of alternate ones of the internal electrode layers are covered with an insulative portion, and the other ends are electrically connected by a conductive portion covering the insulative portions, so that each piezoelectric layer is sandwiched between internal electrode layers of different polarities.

This configuration, however, still has the problem of durability of the piezoelectric device.

Specifically, in view of the fact that the stacked piezoelectric device is displaced along the height of the stack, stress acts on the side electrodes along the height of the stack. Since the conductive portions are formed only at the required points, the mechanical strength of the conductive portions is so low that they can easily become separated from the internal electrode layers.

As described above, with the configuration having conductive portions to energize the internal electrode layers formed over the entire surface of the piezoelectric layers, it is difficult to produce a piezoelectric device high in durability.

SUMMARY OF THE INVENTION

The present invention has been achieved in view of the problems of the prior art described above, and the object thereof is to provide a stacked piezoelectric device having a high durability and a method of fabrication thereof with a simplified production process control.

According to a first aspect of the invention, there is provided a stacked piezoelectric device comprising:

a piezoelectric stack including piezoelectric layers adapted to extend and contract in accordance with a voltage applied thereto and internal electrode layers for supplying the applied voltage, the piezoelectric layers and the internal electrode layers being stacked alternately with each other; and a first side electrode arranged on one side of the piezoelectric stack and a second side electrode arranged on the other side of the piezoelectric stack, the side electrodes being so configured that the internal electrode layers adjacent to each other with a piezoelectric layer therebetween are energized to different polarities;

wherein the piezoelectric layers and the internal electrode layers are configured to have substantially the same area;

wherein said internal electrode layers have the ends thereof exposed to the sides of the piezoelectric stack;

wherein the first side electrode has a first insulating portion formed to cover each of the ends of alternate ones of the internal electrode layers exposed to one side of the piezoelectric stack, a first conductive portion being arranged over the first insulating portions along the height of the piezoelectric stack;

wherein the first side electrode energizes alternate ones of the internal electrode layers;

wherein the second side electrode has a second insulating portion formed to cover each of the ends of alternate ones of the internal electrode layers not formed with the first insulating portion on the other side of the piezoelectric stack, a second conductive portion being arranged over the second insulating portions along the height of the piezoelectric stack;

wherein the second side electrode energizes alternate ones of the internal electrode layers;

wherein the first and second insulating portions are formed of an insulative resin; and the first and second conductive portions are formed of a conductive resin.

The most notable feature of the present invention is that the piezoelectric layers and the internal electrode layers are configured to have substantially the same area, that each internal electrode layer has an end thereof exposed to a side of the piezoelectric stack, that the first and second side electrodes include the first and second insulating portions, respectively, covering the ends of the internal electrode layers and the first and second conductive portions arranged on the first and second insulating portions, respectively, and that the first and second insulating portions are formed of an insulative resin while the first and second conductive portions are formed of a conductive resin.

The operation of the present invention will now be explained.

The fact that the piezoelectric layers and the internal electrode layers have substantially the same area, i.e. that the internal electrode layers are formed over the entire surface of the piezoelectric layers (FIG. 2) eliminates the need to control the area in which the internal electrode layers are formed on the piezoelectric layers.

This facilitates the process control for fabricating the piezoelectric device.

Also, both the insulative portions and the conductive portions are formed of a resin and have a high elasticity. As a result, the stacked piezoelectric device is less likely to be damaged or broken by stress caused or derived by displacement.

Further, in view of the fact that the piezoelectric layers and the internal electrode layers have the same area, each of the piezoelectric layers is sandwiched between the adjacent internal electrode layers over the entire surface thereof. Therefore, the piezoelectric layers do not have a portion M which tends to be displaced, or a portion N which does not tend to be displaced, and therefore the piezoelectric layers are less likely to be damaged by displacement.

In this way, a stacked piezoelectric device having high durability can be produced. Also, the stacked piezoelectric device can be used very reliably for a long time repeatedly or in a harsh operating environment.

Further, the durability can be improved of a high-performance piezoelectric device having a large displacement along the height of the stack.

As described above, according to this invention, a stacked piezoelectric device is provided which has high durability and the process control for manufacture of which is simplified.

Since the stacked piezoelectric device according to this invention can be repeatedly used in a harsh operating environment and maintain high durability against a large displacement, it is suitable as a drive source of an injector.

If the piezoelectric stack is parallelepipedal as shown in FIG. 1, it can include one side and the opposed side of the parallelepiped on which the first side electrode and the second side electrode can be formed, respectively (see FIG. 9).

In the case of a piezoelectric stack having curved sides, on the other hand, the first side electrode having an appropriate peripheral width is formed on the outer side, and the second side electrode having an appropriate width is formed at a peripherally distant position from the first side electrode (see FIG. 10).

The sides may be present at the so-called corners (see FIG. 10).

According to the second aspect of the invention, the insulative resin is preferably formed of a selected one of epoxy resin, polyimide resin, silicon resin, fluoro resin, urethane resin, acrylic resin, nylon resin and polyester resin.

These resins have superior elasticity, and therefore the first and second side electrodes are not easily damaged or broken due to stress applied thereto by displacement of the stacked piezoelectric device.

Also, it is especially desirable to use epoxy resin, polyimide resin, silicon resin or fluoro resin. All of these resins have not only the elasticity described above, but also superior heat resistance, oil resistance and chemical resistance. It is therefore possible to produce a stacked piezoelectric device which does not easily degenerate even in a harsh operation environment.

According to the third aspect of the invention, the conductive resin contains a metal material and a resin material, the metal material preferably being formed of at least a selected one of silver, gold, copper, nickel, a silver-palladium compound, carbon and tin.

The above-mentioned metal material formed of at least selected one of silver, gold, copper, nickel, a silver-palladium compound, carbon and tin has high conductivity, which ensures conduction with the internal electrodes, thereby making it possible to produce a stacked piezoelectric device having high performance.

In particular, gold, silver and a silver-palladium compound have extremely small migration, resulting in improved humidity resistance of the stacked piezoelectric device.

According to the fourth aspect of the invention, the conductive resin contains a metal material and a resin material, the resin material preferably being formed of at least a selected one of epoxy resin, polyimide resin, silicon resin, fluoro resin, urethane resin, acrylic resin, nylon resin and polyester resin.

These resins have superior elasticity, and therefore the first and second side electrodes are not easily damaged or broken due to stress applied thereto from displacement of the stacked piezoelectric device.

Also, it is especially desirable to use epoxy resin, polyimide resin, silicon resin or fluoro resin. All of these resins have not only the elasticity described above, but are also have superior heat resistance, oil resistance and chemical resistance. It is therefore possible to produce a stacked piezoelectric device which does not easily degenerate even in a harsh operation environment.

According to the fifth aspect of the invention, the amount of the metal material added to the conductive resin is preferably 50 to 90% by weight.

As a result, the first and second side electrodes have sufficient conductivity. If the amount of the metal material added is less than 50% by weight, the probability of the metal materials being brought into contact with each other is greatly reduced, with the result that there may not be conductivity between the first and second electrodes.

On the other hand, in the case where the amount added is larger than 90% by weight, the amount of the resin material is insufficient and mutual contact between the metal materials may become unstable. In other words, the resin material ensures the contact of the metal materials, and therefore in the case where the amount of the resin material is too small, the conductivity of the first and second side electrodes may be unstable.

The amount of the metal material added is defined as the amount of the metal material contained in the conductive resin which is assumed to be 100% by weight. In other words, a preferable range according to this aspect is 50% by weight of the metal material and 50% by weight of the resin material to 90% by weight of the metal material and 10% by weight of the resin material.

According to the sixth aspect of the invention, the modulus of elasticity of the insulative resin and the conductive resin is preferably 0.1 MPa to 40 GPa.

As a result, when the stacked piezoelectric device is in operation, the first and second side electrodes are not easily cracked and therefore a device having high durability can be produced.

In the case where the modulus of elasticity is less than 0.1 MPa, the mutual contact between the metal materials contained in the conductive resin may become unstable. Thus, the conductivity of the first and second side electrodes may also become unstable.

On the other hand, in the case where the modulus of elasticity is larger than 40 GPa, the first and second side electrodes cannot be expanded or contracted according to the expansion/contraction of the piezoelectric stack making up the piezoelectric device in operation, so that the side electrodes may develop cracking and their conductivity is liable to be reduced.

Preferably, in order to stabilize the connection between the metal materials, the modulus of elasticity of the insulative resin and the conductive resin is 1 MPa.

According to the seventh aspect of the invention, the specific electric resistance of the insulative resin is preferably not less than $10^8$ Ω/cm.

As a result, insulation can be ensured in the first and second insulating portions. On the other hand, in the case where the specific electric resistance is less than $10^8$ Ω/cm, the insulation characteristics of the first and second insulating portions are so low that it is difficult to apply positive and negative power to the two sides of the piezoelectric layer, and thus the performance of the stacked piezoelectric device is liable to be reduced, since in this case, the higher the specific electric resistance, the better.

According to the eighth aspect of the invention, the specific electric resistance of the conductive resin is preferably not more than $10^{-1}$ Ω/cm.

As a result, conduction can be ensured in the first and second conducting portions without fail. On the other hand, in the case where the specific electric resistance is larger than $10^{-1}$ Ω/cm, the conduction characteristic of the first and second conducting portions is so low that it may become difficult to apply a voltage to the piezoelectric layers through the first and second side electrodes.

In this particular case, the smaller the specific electric resistance, the better.

According to the tenth aspect of the invention, the piezoelectric device preferably comprises first and second lead-out electrodes electrically connected to the first and second side electrodes.

As a result, a power supply or the like can be easily connected to the first and second side electrodes.

According to the eleventh aspect of the invention, the piezoelectric device preferably comprises first and second lead-out electrodes at least partly buried in the first and second side electrodes and connected to the conductive resin when the latter is formed.

As a result, the side electrodes are formed at the same time that the first and second lead-out electrodes are coupled, thereby simplifying the process control and reducing the number of steps for fabricating a stacked piezoelectric device according to this aspect.

According to the twelfth aspect of the invention, the electric conduction of the first and second lead-out electrodes is preferably ensured from one end portion along the height of the piezoelectric stack to the other end portion thereof.

As a result, the first and second lead-out electrodes can be connected more firmly to the stacked piezoelectric device. Also, even in the case where part of the lead-out electrodes becomes separated, the fact that electric conduction is ensured from the top to the bottom of the piezoelectric stack results in high reliability.

According to the thirteenth aspect of the invention, the first and second lead-out electrodes are preferably corrugated, slitted, combed or meshed in shape.

The first and second lead-out electrodes having the above-mentioned shapes have high flexibility, and can easily absorb displacement. Therefore, the first and the second lead-out electrodes do not easily come off or lose contact from the piezoelectric stack when the piezoelectric device is expanded or contracted along the height of the stack, thereby improving the reliability of the piezoelectric device.

According to the fourteenth aspect of the invention, a thin electrode film is preferably interposed between the first and second conducting portions and the side surfaces of the piezoelectric stack (see FIG. 13).

As a result, the close contact between the first and second conducting portions and the piezoelectric stack and the electric conductivity with the internal electrode layers can be improved.

A thin conductive film is formed on a part or the whole of the contact surface between the first and second conducting portions and the piezoelectric stack. Of course, the thin electrode film can also be formed after the first and second insulating portions. The thin electrode film may be interposed between the first and second insulating portions and the first and second conducting portions. The absence of the thin electrode film is desirable up to the upper and lower ends of the piezoelectric stack, in order to ensure insulation.

According to the fifteenth aspect of the invention, the thin electrode film is preferably a plated film or a vapor deposited film.

As a result, a uniform thin electrode film in close contact with the piezoelectric stack can be formed.

The invention according to the sixteenth aspect relates to a method of fabricating a stacked piezoelectric device as described in claims 1 to 15, and characterized in that after forming the insulative resin layers on the side surfaces of the piezoelectric stack, the insulative resin layers are removed from alternate ones of the piezoelectric layers thereby to form an insulating portion.

As a result, the process control such as for the insulation distance is eliminated, and the subsequent process control can be facilitated.

According to the seventeenth aspect of the invention, the insulative resin layer is preferably formed by a selected one of the ink jet method and the printing method.

According to these methods, the thickness and width and the coating distance of the insulative resin layers are easily controlled, and therefore an insulative resin layer of a predetermined shape can be accurately produced.

According to the eighteenth aspect of the invention, the insulative resin layers are preferably removed by the laser or photolithography method.

According to these methods, fine control of partial removal can be easily effected so that an insulating resin layer of precise size and shape can be attained.

BRIEF DESCRIPTION OF THE DRAWINGS

The above described object and features of the present invention will be more apparent from the following description of the preferred embodiments when read with reference to the accompanying drawings, of which:

FIG. 14 is a diagram for explaining a conventional stacked piezoelectric device; and FIG. 15 is a diagram for explaining the problems of the prior art.

DESCRIPTION OF THE PREFERRED EMBODIMENTS (First Embodiments)

A stacked piezoelectric device and a method of fabrication thereof according to the first embodiment of the present invention will be explained with reference to FIGS. 1 to 4.

Figure 1:
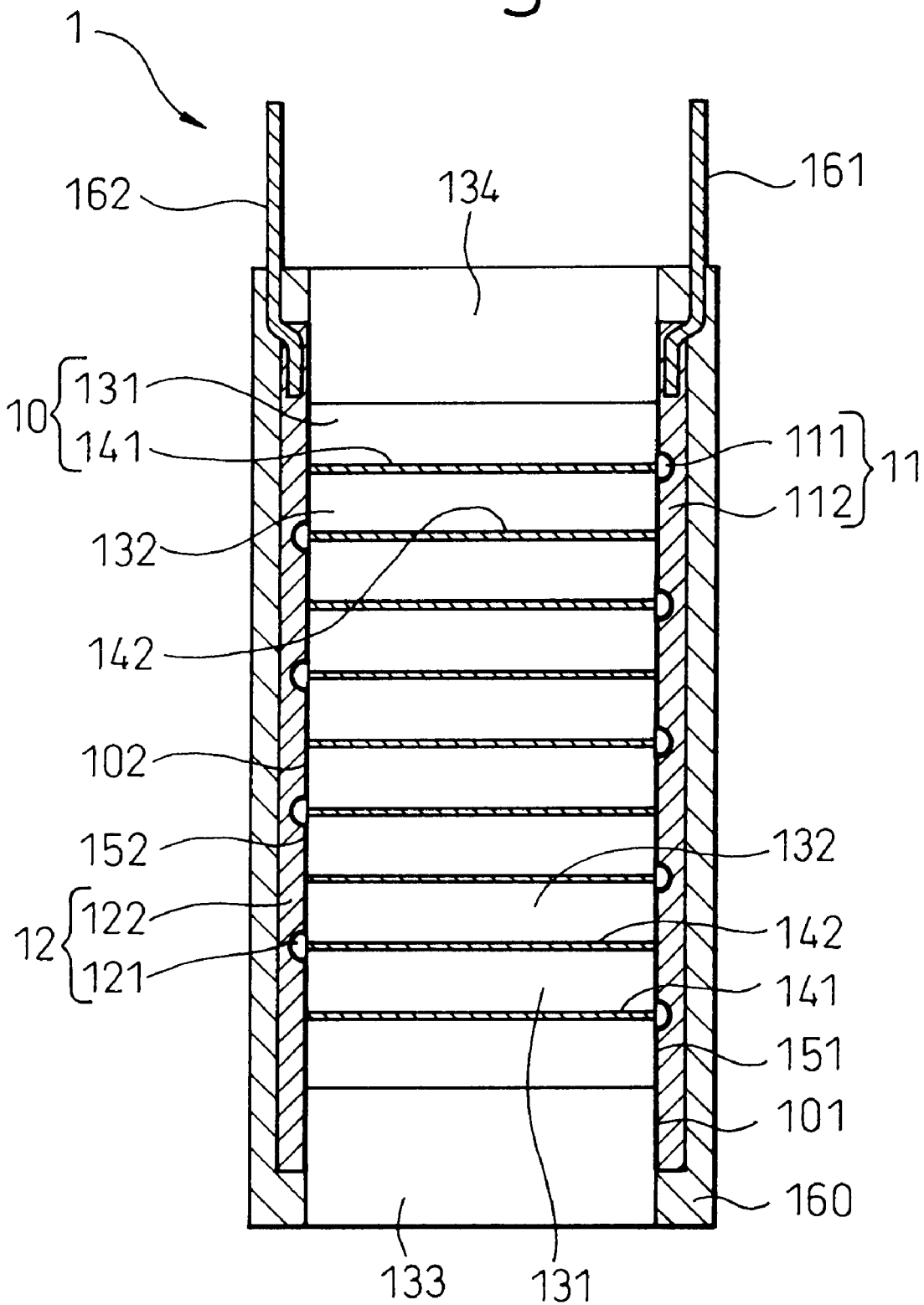
FIG. 1 is a sectional view for explaining a stacked piezoelectric device according to the first embodiment of the invention.

A stacked piezoelectric device 1 according to this embodiment, as shown in FIGS. 1 and 2, comprises a piezoelectric stack 10 including piezoelectric layers 131 and 132 which are adapted to extend and contract in accordance with an applied voltage and stacked alternately with internal electrode layers 141 and 142 for supplying the applied voltage, and a first side electrode 11 formed on the side 101 and a second side electrode 12 formed on the side 102 of the piezoelectric stack 10, wherein adjacent ones of the internal electrode layers 141 and 142, with corresponding ones of the piezoelectric layers 131 and 132 therebetween, are energized with different polarities by the side electrodes 11 and 12.

Figure 2A:
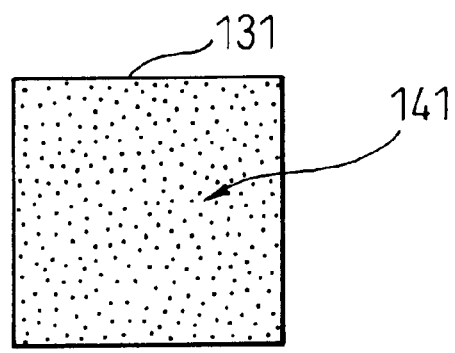
FIG. 2A is a diagram for explaining the state in which the internal electrodes are arranged on the piezoelectric layers.
Figure 2B:
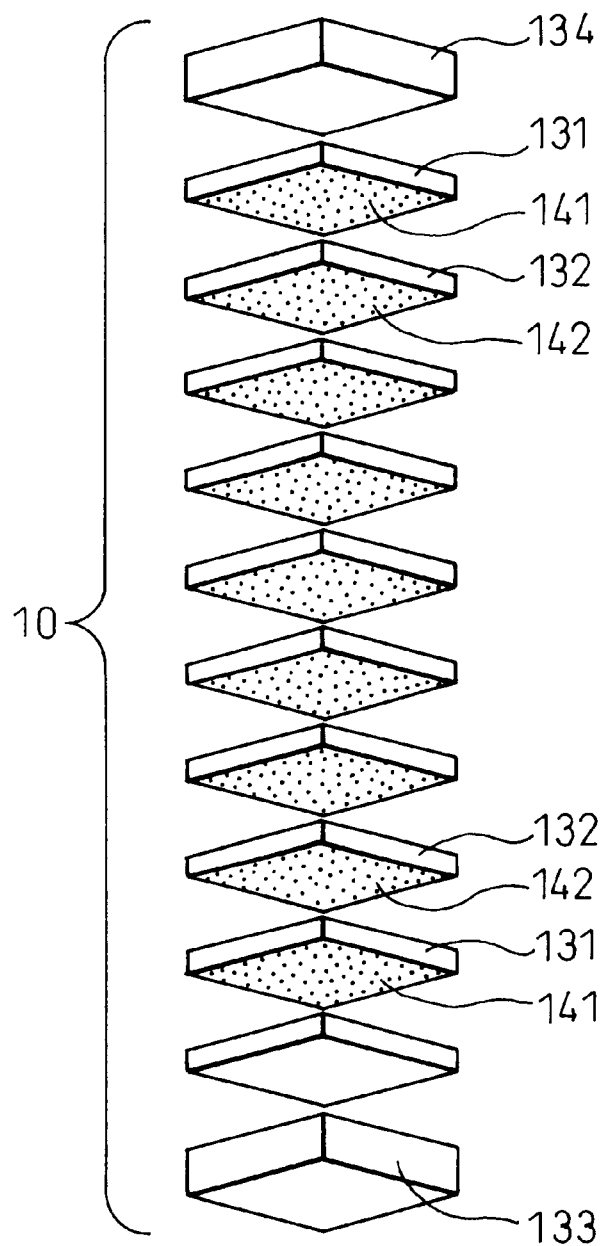
FIG. 2B is a perspective view of a piezoelectric stack according to the first embodiment of the invention.

AS shown in FIGS. 2A and 2B, the piezoelectric layers 131 and 132 and the internal electrode layers 141 and 142 of the piezoelectric stack 10 are configured to have the same area.

Also, as shown in FIG. 1, alternate ones of the internal electrode layers 141 each have an end thereof exposed to the side 101 of the piezoelectric stack 10, and each end of the internal electrode layers 141 exposed to the side 101 of the first side electrode 11 is covered with a first insulative portion 111. A first conductive portion 112 is formed along the height the piezoelectric stack 10 over the first insulative portions 111.

AS shown in FIG. 1, each of alternate ones of the internal electrode layers 142 not having the first insulative portion 111 formed on the side 102 has an end thereof exposed to the second side electrode 12, which end is covered with a second insulative portion 121, and a second conductive portion 122 is arranged along the height of the piezoelectric stack 10 over the second insulative portions 121 through a thin layer electrode film 123.

The first and second insulative portions 111 and 112 are formed of an insulative resin, while the first and second conductive portions 112 and 122 are formed of a conductive resin.

A detailed explanation will be given below.

The stacked piezoelectric device 1 according to this embodiment has the first and second side electrodes 11 and 12 formed on the opposed sides 101 and 102, respectively, of the parallelepipedal piezoelectric stack 10.

The piezoelectric stack 10, as shown in FIGS. 2A and 2B, is formed of the piezoelectric layers 131 and 132 and the internal electrode layers 141 and 142 having the same area and stacked alternately with each other. The piezoelectric layers 134 and 133 arranged at the upper and lower ends, respectively, of the piezoelectric stack 10 are what are called dummy layers having no internal electrode layers 141 and 142 with adjacent piezoelectric layers 131 and 132.

The internal electrode layers 141 and 142 are exposed to the four sides of the piezoelectric stack 10.

As shown in FIG. 1, the end of every other internal electrode layer 141 exposed to the side 101 has the first insulative portion 111. Each first insulative portion 111 is formed of epoxy resin protruding from the surface of the side 101.

Figure 3:
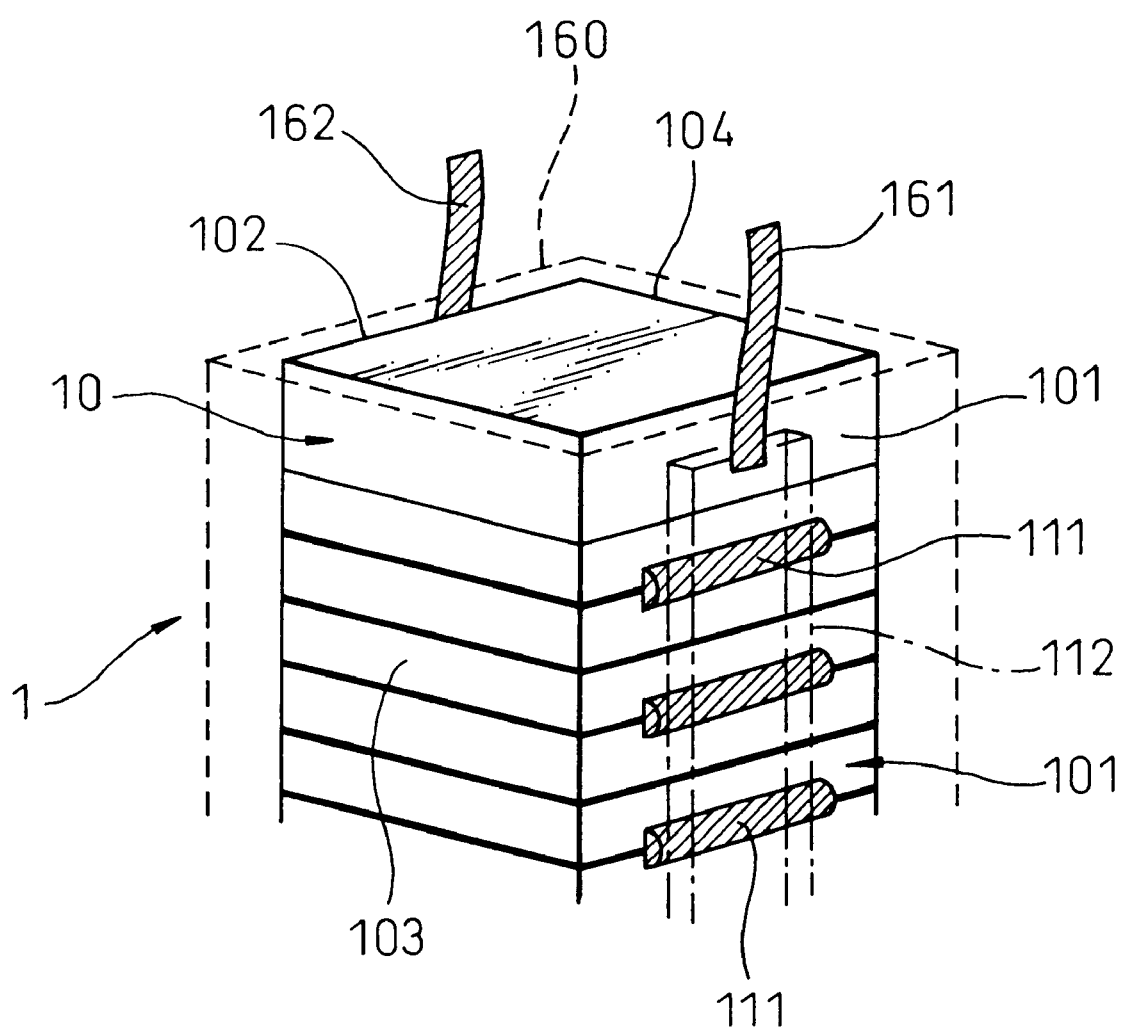
FIG. 3 is a diagram for explaining the essential parts of a stacked piezoelectric device according to the first embodiment of the invention.

As shown in FIG. 3, the first conductive portion 112 having a lower width than the first insulative portion 111 is formed on the side 101 in such a manner as to cover all the first insulative portions 111 along the height of the stack. The first conductive portion 11 is made of epoxy resin containing silver.

The first insulative portions 111 and the first conductive portions 112 make up the first side electrode 11.

The side surface of the piezoelectric stack 10 has a width of 40 mm, and the first side electrode arranged almost at the center of the side 101 has a width of 3 mm. The first insulative portion 111 is transversely longer than the first conductive portion 112.

The second side electrode 12 has a similar configuration to the first side electrode 11, but is different from the first side electrode 11 in that the second insulative portion 121 is arranged at the end of alternate ones of the internal electrode layers 142.

AS shown in FIGS. 1 and 3, the side electrodes 11 and 12 are connected with lead wires 161 and 162 which function as the first and second lead electrodes, respectively, through which power for driving the piezoelectric device 1 is supplied from an external power source.

AS shown in FIG. 3, a moisture-proof resin coat 160 is formed to cover the entire four side surfaces of the piezoelectric stack 10 including the other sides 103 and 104, the side electrodes 11 and 12 and the remaining portions of the sides 101 and 102 which are not covered by the side electrodes 11 and 12.

Now, a method of fabricating the stacked piezoelectric device 1 according to this embodiment will be explained.

A green sheet for the piezoelectric layers 131 and 132 is prepared. Powder of lead oxide, zirconium oxide and strontium oxide making up the main materials of the piezoelectric device are measured to a predetermined composition. These component elements, however, are prescribed with lead richer by 1 to 2%, taking the volatilization of the lead component into consideration.

The material thus prepared is dry mixed in a mixer and calcinated at 800 to 900° C. Pure water and a dispersing agent are added to the resulting calcinated powder to form a slurry, which is wet ground by such means as a bar mill.

The object thus ground is dried and degreased, after addition of a solvent, a binder, a plasticizer and a dispersing agent, which are mixed in a ball mill.

The resulting slurry is formed into a green sheet of a predetermined thickness by a doctor blade machine. The green sheet is punched in press or cut by cutter into a sheet of piezoelectric layer of a predetermined size.

Then, a conductive paste for forming the internal electrode layers is prepared. The conductive paste thus prepared contains silver and palladium in a ratio of 7 to 3. This conductive paste is printed on the piezoelectric layer sheet to a predetermined thickness to form a printed portion of the internal electrode layers.

The piezoelectric layer sheets formed with the printed portion are stacked in the manner shown in FIGS. 2A and 2B. The green sheets not formed with the internal electrode layer are placed at the upper and lower ends of the stack, and all the green sheets are thermally bonded to produce a laminate body of a piezoelectric stack. The thermal bonding is carried out at 120° C. under a pressure of 34 Pa/cm$^2$.

The laminate body is degreased at 400 to 700° C. in an electric furnace, and baked at 900 to 1200° C., after which the entire surfaces of the laminate body are polished to produce a piezoelectric stack of a predetermined size.

Figure 4A:
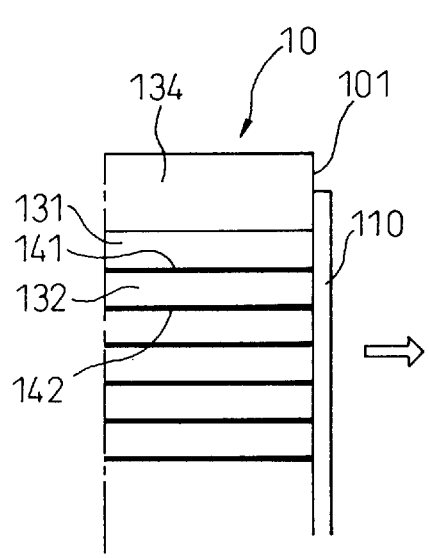
FIGS. 4A–4C are diagrams for explaining the process for forming the first insulative portions and the first conductive portion on the piezoelectric stack according to the first embodiment of the invention.

After that, as shown in FIG. 4A, an insulative resin is printed to a predetermined width on the side 101 substantially over the entire height of the stack. The thickness is about 50 to 100 $\mu$m. The printed portion is hardened to form an insulative resin layer 110.

Figure 4B:
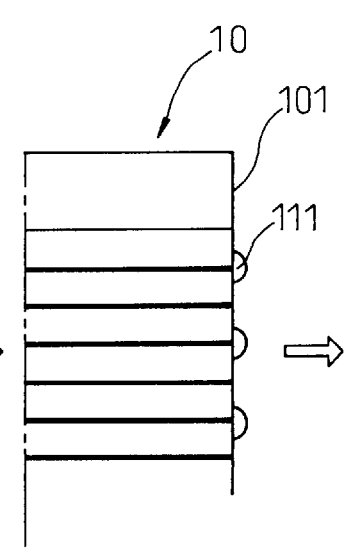

Then, as shown in FIG. 4B, a laser beam is radiated on alternate ones of the piezoelectric layers to remove the unrequired portions. In FIG. 4B, only one side 101 is shown, and the portions of the other side 102, though not shown, are removed in staggered fashion with respect to the portions shown of the first side (FIG. 1). As a result, the first insulative portions 111 are formed.

Instead of a laser beam, the photolithography can be used to remove the unrequired portions.

Figure 4C:
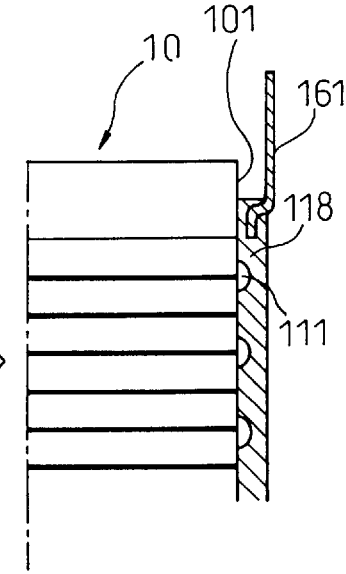

Then, as shown in FIG. 4C, the conductive resin is coated in such a manner as to bury the lead wire 161 over a width smaller than the first insulative portions 111, thereby to form a conductive resin layer 118.

After that, the conductive resin layer 118 is hardened thereby to form a first conductive portion 112.

In this way, the first side electrode 11 is formed on the side 101 of the piezoelectric stack 10, and the lead wire 161 is connected to the first side electrode 11. A similar method is employed also to form the second side electrode 12 and the lead wire 162.

Then, all the side surfaces of the piezoelectric stack 10 are coated with a moisture-proof resin by being dipped into the insulative resin, and thus the stacked piezoelectric device 1 according to this embodiment is completed.

The performance of the stacked piezoelectric device according to this embodiment was evaluated.

By operating the stacked piezoelectric device according to this embodiment shown in FIG. 1, the displacement amount and the number of operations of the device were measured.

Also, a similar measurement was taken by operating the conventional stacked piezoelectric device shown in FIG. 14. The result is shown in FIG. 5.

Figure 5:
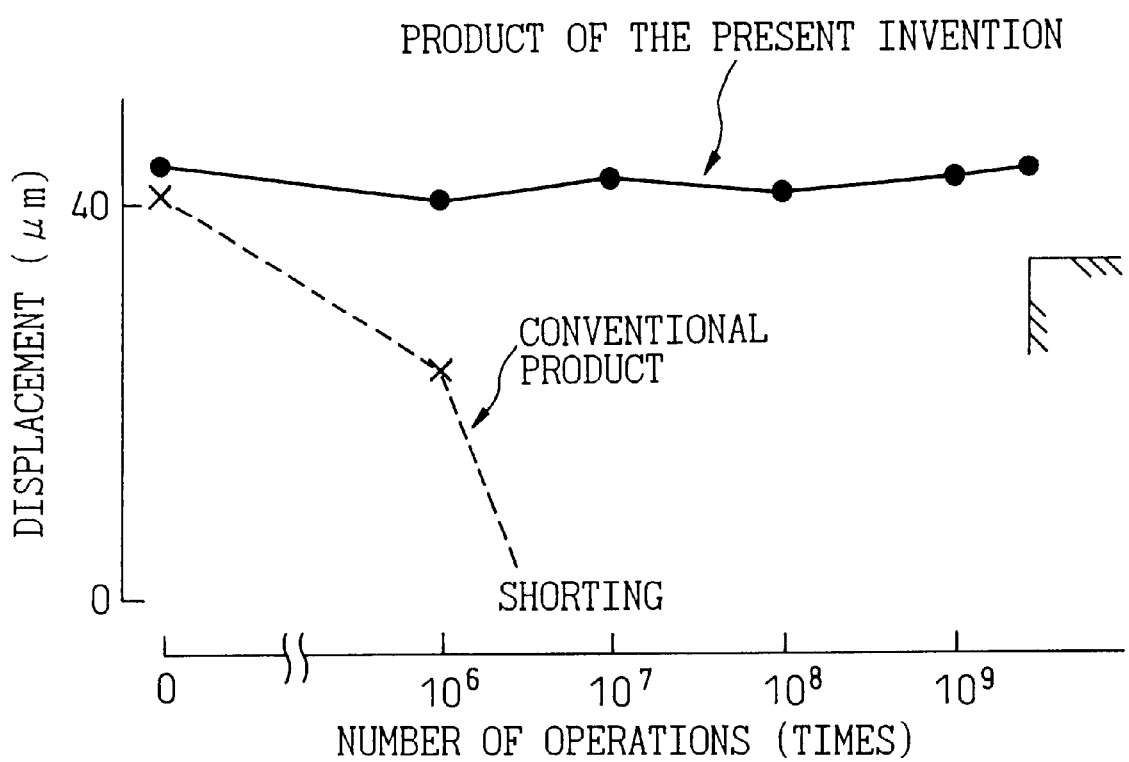
FIG. 5 is a diagram showing the relation between the displacement and the number of operations in the conventional stacked piezoelectric device and the first embodiment of the present invention.

As seen from FIG. 5, the displacement amount was reduced sharply, while shorting occurred in the conventional device when the number of operations exceeded $10^6$.

With the device according to the invention, in contrast, the displacement amount remained substantially the same as at the very beginning (when the number of operations was 0) even after the number of operations reached $10^9$.

The functions and effects of this embodiment will now be explained.

With the stacked piezoelectric device 1 according to this embodiment, as shown in FIG. 2, the piezoelectric layers 131 and 132 have the same area as the internal electrode layers 141 and 142, which are configured over the entire surfaces of the piezoelectric layers 131 and 132. During fabrication, therefore, it is not necessary to manage the area in which the internal electrode layers 141 and 142 are formed on the piezoelectric layers 131 and 132, thereby facilitating process control.

Also, in view of the fact that the first and second insulative portions 111 and 121 and the first and second conductive portions 112 and 122 are both made of resin, the side electrodes 11 and 12 having high elasticity can be produced. As a result, the side electrodes 11 and 12 are not easily damaged or broken due to stress caused by the displacement of the stacked piezoelectric device 1. Also, the side electrodes 11 and 12 are not easily separated from the internal electrode layers 141 and 142.

Further, in view of the fact that the piezoelectric layers 131 and 132 and the internal electrode layers 141 and 142 have the same area, each of the piezoelectric layers 131 and 132 is sandwiched over the entire surface thereof between adjacent ones of the internal electrode layers 141 and 142. Therefore, there is no portion M which tends to be displaced or a portion N which does not tend to be displaced, unlike in the prior art shown in FIG. 15. Thus, the possibility of damage to the piezoelectric layers 131 and 132, which otherwise might be caused by such portions M and N, is eliminated.

As a result, according to this embodiment, a stacked piezoelectric device having high durability can be produced. For this reason, the device can be repeatedly used for a long time very reliably in a harsh operating environment (FIG. 5).

Further, an application of the embodiment to a high-performance piezoelectric device which can be displaced to a considerable degree along the height of the stack provides higher durability than in the prior art.

As described above, according to this embodiment, a stacked piezoelectric device high in durability and a method of fabrication thereof the process control of which can be easily carried out at the time of fabrication are provided.

Although this embodiment employs a method of forming the first and second insulative portions 111 and 121 in such a way that an insulative resin layer is formed over the entire surface along the height of the stack (FIG. 4A), and then the unrequited portions are removed (FIG. 4B), instead of this method, the first and second insulative portions 111 and 121 can be produced by forming an insulative resin layer only in the required portion by partial printing and hardening it.

Embodiment 2

Stacked piezoelectric devices having different shapes of piezoelectric layer according to this embodiment are shown in FIGS. 6 to 12.

Figure 6:
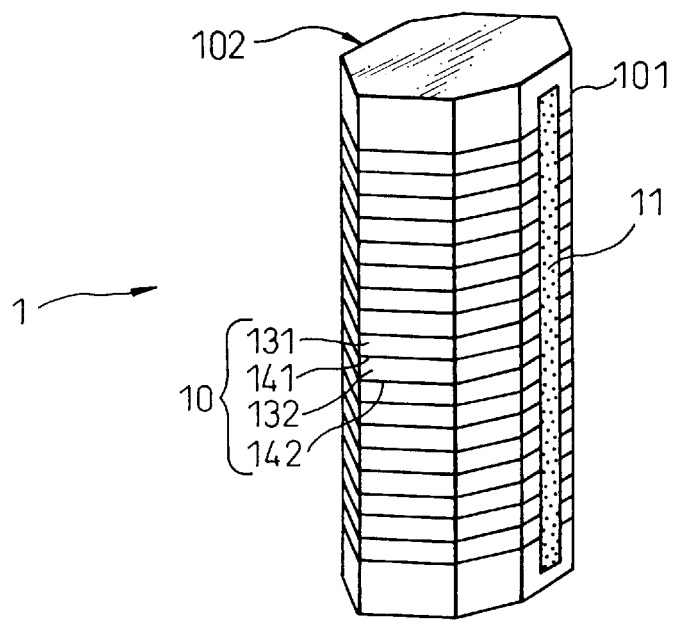
FIG. 6 is a perspective view of a stacked piezoelectric device comprising octagonal piezoelectric layers according to the second embodiment.
Figure 7:
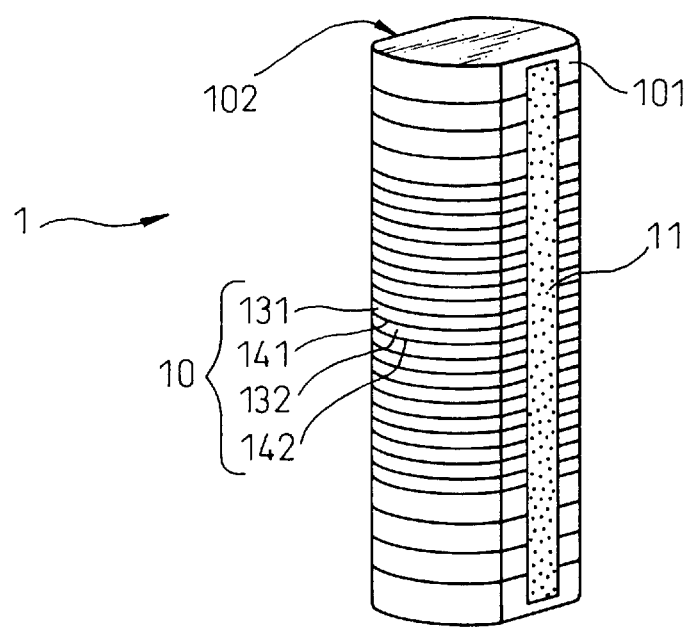
FIG. 7 is a perspective view of a stacked piezoelectric device comprising barrel-shaped piezoelectric layers according to the second embodiment.

FIG. 6 shows a stacked piezoelectric device 1 having piezoelectric layers 131 and 132, and internal electrode layers 141 and 142 having an octagonal shape. Also, FIG. 7 shows a stacked piezoelectric device having piezoelectric layers 131 and 132, and internal electrode layers 141 and 142 in the shape of a barrel.

Both have a first side electrode 11 and a second side electrode, not shown, on the side surfaces 101 and the side surface 102 in opposed relation to the side surface 101.

Other detailed parts are similar to those of the first embodiment.

Figure 8:
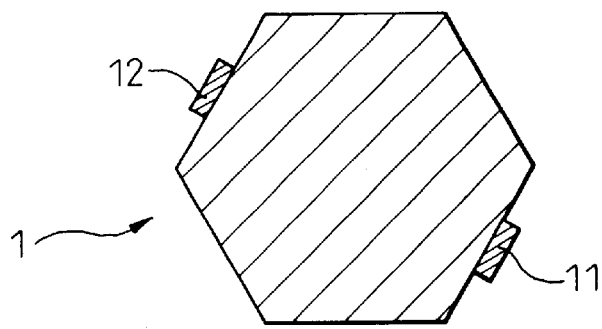
FIG. 8 is a diagram for explaining the arrangement of the first and second side electrodes of a stacked piezoelectric device having a hexagonal section according to the second embodiment.

FIGS. 8 to 11 show the positions at which the first and second side electrodes 11 and 12 are arranged in the stacked piezoelectric device 1. FIG. 8 shows a configuration having a hexagonal section with the first and second side electrodes 11 and 12 arranged on the opposed side surfaces.

Figure 9:
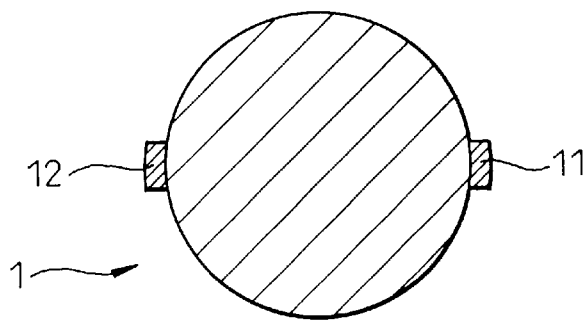
FIG. 9 is a diagram for explaining the arrangement of the first and second side electrodes of a stacked piezoelectric device having a circular section according to the second embodiment.

FIG. 9 shows a stacked piezoelectric device having a circular section with the first and second side electrodes 11 and 12 arranged at positions of the circle in diametrically opposed relation to each other.

Figure 10:
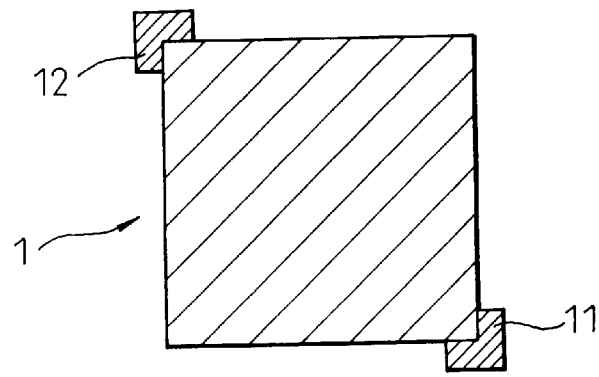
FIG. 10 is a diagram for explaining the arrangement of the first and second side electrodes of a stacked piezoelectric device having a square section according to the second embodiment.
Figure 11:
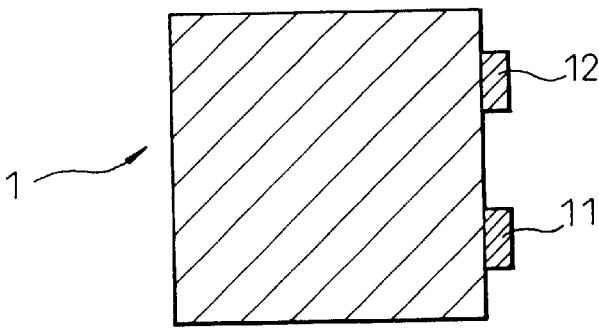
FIG. 11 is a diagram for explaining the arrangement of the first and second side electrodes of a stacked piezoelectric device having a square section according to the second embodiment.

FIGS. 10 and 11 show a configuration having a square section, in which FIG. 10 shows a stacked piezoelectric device 1 having the first and second side electrodes 11 and 12 arranged at the corners at the diagonal ends of the square. FIG. 11, on the other hand, shows a configuration having the first and second side electrodes arranged adjacent to each other.

Other details of the configuration are similar to those of FIG. 1.

In any other configuration, a similar effect to the first embodiment can be produced as long as the first and second side electrodes are arranged in a manner so as not to be connected electrically (i.e. if the first electrode is a positive electrode, then the second electrode is made to be negative).

Embodiment 3

Figure 12:
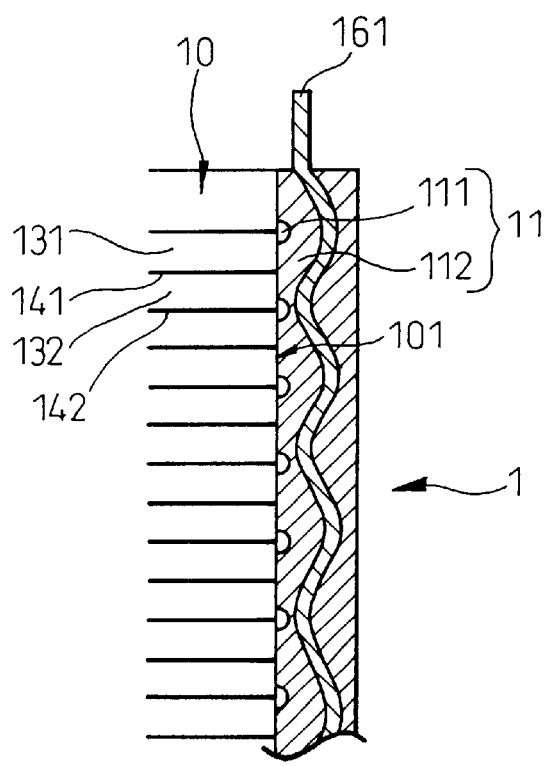
FIG. 12 is a diagram for explaining the essential parts of a stacked piezoelectric device comprising the lead-out electrodes having a corrugated shape according to the third embodiment.

As shown in FIG. 12, this embodiment relates to a stacked piezoelectric device comprising first and second lead-out electrodes made of a corrugated metal plate.

As shown, the end portions of the internal electrode layers 141 and 42 are exposed to the side surface 101 of the piezoelectric stack 10. The first insulating portions 111 are arranged in alternate layers to cover the end portions of the internal electrode layers 141, and the first conductive portions 112 are arranged on the first insulating portions 111 along the height of the piezoelectric stack 10 thereby to make up the first side electrode 11.

The first lead-out electrode 161 is buried in the first conducting portions 112 of the first side electrode Though not shown, the same can be said of the second side electrode.

Other details are similar to those of the first embodiment.

According to this embodiment, the stacked piezoelectric device 1 has the first and second lead-out electrodes consisting of corrugated metal plates buried in the first conducting portion and the second conducting portion, and therefore conduction is always ensured between the first side electrode 11 and the first lead-out electrode 161 and between the second side electrode and the second lead-out electrode. The piezoelectric stack 10 is expanded/contracted along the height of the stack. However, since the matal plate has the corrugated shape, it can withstand expansion/contraction.

It should be noted that all of the first and second lead-out electrodes having the corrugated shape do not always have to be buried in the first and second conductive portions. When parts of the lead-out electrodes are buried, the amount of the material of the first conductive portion can be reduced.

Other functions and effects are similar to those of the first embodiment.

Embodiment 4

Figure 13:
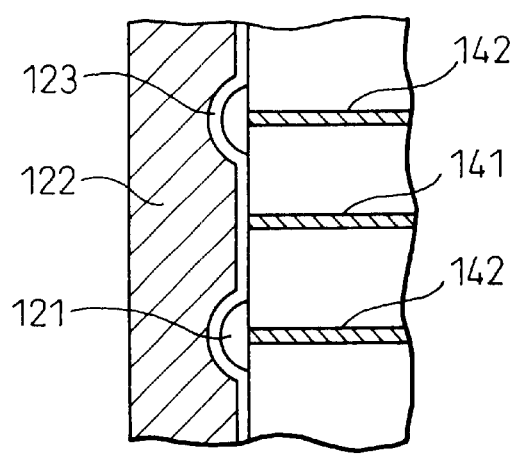
FIG. 13 is a diagram for explaining a main part of a stacked piezoelectric device having a thin electrode film according to a fourth embodiment.

As shown in FIG. 13, a stacked piezoelectric device 1 according to this embodiment has a second insulating portion 121 and a thin electrode film 123. The thin electrode film 123 is provided between the side 102 of the piezoelectric stack 10 and the second conductive portion 122. In the figure, only the second insulating portion 121 and the second conductive portion 122 are shown. However, the first insulating portion and the first conductive portion are similarly provided.

The other detailed construction is the same as that of the first embodiment.

Since the stacked piezoelectric device 1 according to this embodiment has the thin electrode film 123, contact between the first and second conductive portions and the piezoelectric stack can be ensured, as can electrical conductivity to the internal electrode layers.

Other functions and effects are similar to those of the first embodiment.

What is claimed is:

1. A stacked piezoelectric device comprising:

a piezoelectric stack including piezoelectric layers adapted to extend and contract in accordance with the applied voltage, and internal electrode layers for supplying the applied voltage, each of said piezoelectric layers being stacked alternatively with the corresponding one of said internal electrode layers; and a first side electrode arranged on one side of the piezoelectric stack and a second side electrode arranged on the other side of the piezoelectric stack, the internal electrode layers being so configured that adjacent ones thereof with a piezoelectric layer therebetween are energized to different polarities by each side electrode;

wherein the piezoelectric layers and the internal electrode layers are configured to have substantially the same area;

wherein said internal electrode layers have the ends thereof exposed to the sides of the piezoelectric stack;

wherein the first side electrode includes a plurality of first insulating portions formed to cover alternate ones of the ends of the internal electrode layers exposed to one side of the piezoelectric stack, a first conductive portion being arranged on said first insulating portions along the height of the piezoelectric stack;

wherein the first side electrode energizes alternate ones of said internal electrode layers;

wherein the second side electrode includes a plurality of second insulating portions formed to cover those alternate ones of the ends of the internal electrode layers which are exposed to the other side of the piezoelectric stack and not formed with said first insulative portions, a second conductive portion being arranged on said second insulating portions along the height of the piezoelectric stack;

wherein said second side electrode energizes alternate ones of said internal electrode layers;

wherein the first and second insulating portions are configured of an insulative resin;

wherein the first and second conductive portions are configured of a conductive resin and formed to directly cover the ends of the internal electrode layers; and wherein the modulus of elasticity of said insulative resin and said conductive resin is 0.1 MPa to 40 GPa.

2. A stacked piezoelectric device according to claim 1, characterized in that said insulative resin is formed of at least selected one of epoxy resin, polyimide resin, silicon resin, fluoro resin, urethane resin, acrylic resin, nylon resin and polyester resin.

3. A stacked piezoelectric device according to claim 1, characterized in that said conductive resin contains a metal material and a resin material, said metal material being formed of at least selected one of silver, gold, copper, nickel, a silver-palladium compound, carbon and tin.

4. A stacked piezoelectric device according to claim 1, characterized in that said conductive resin contains a metal material and a resin material, said resin material being formed of at least a selected one of epoxy resin, polyimide resin, silicon resin, fluoro resin, urethane resin, acrylic resin, nylon resin and polyester resin.

5. A stacked piezoelectric device according to claim 3, characterized in that the amount of said metal material added to said conductive resin is 50 to 90% by weight.

6. A stacked piezoelectric device according to claim 1, characterized in that the specific electric resistance of said insulative resin is not less than $10^8$ Q/cm.

7. A stacked piezoelectric device according to claim 1, characterized in that the specific electric resistance of said conductive resin is not more than $10^{-1}$ $\Omega/cm$.

8. A stacked piezoelectric device according to claim 1, characterized in that said first and second side electrodes are arranged out of contact with each other on the side surfaces of said piezoelectric stack.

9. A stacked piezoelectric device according to claim 1, characterized by comprising first and second lead-out electrodes electrically connected with said first and second side electrodes.

10. A stacked piezoelectric device according to claim 9, characterized in that at least a part of said first and second lead-out electrodes is buried in said first and second side electrodes, said first and second lead-out electrodes being connected to said conductive resin when forming said conductive resin.

11. A stacked piezoelectric device according to claim 9, characterized in that electrical conduction of said first and second lead-out electrodes is secured from one end along the height of said piezoelectric stack to the other end thereof.

12. A stacked piezoelectric device according to claim 9, characterized in that said first and second lead-out electrodes are corrugated, slitted, combed or meshed in shape.

13. A stacked piezoelectric device according to claim 1, characterized in that a thin electrode film is interposed between said first and second conducting portions and the side surfaces of said piezoelectric stack.

14. A stacked piezoelectric device according to claim 13, characterized in that said thin electrode film is a plated film or a vapor deposited film.

15. A method of fabricating a stacked piezoelectric device described in claim 1, characterized in that an insulative resin layer is formed on the side surfaces of said piezoelectric stack, after which the insulative resin layers are removed from said alternate ones of said piezoelectric layers, thereby forming an insulating portion.

16. A method of fabricating a stacked piezoelectric device according to claim 15, characterized in that said insulative resin layer is formed by a selected one of the ink jet method and the printing method.

17. A method of fabricating a stacked piezoelectric device according to claim 15, characterized in that said insulative resin layers are removed by the selected one of the laser method and photolitho method.

* * * * *